United States Patent [19]

Lewis

[11] Patent Number: 4,797,579
[45] Date of Patent: Jan. 10, 1989

[54] CMOS VLSI OUTPUT DRIVER WITH CONTROLLED RISE AND FALL TIMES

[75] Inventor: Edward T. Lewis, Sudbury, Mass.

[73] Assignee: Raytheon Company, Lexington, Mass.

[21] Appl. No.: 78,142

[22] Filed: Jul. 27, 1987

[51] Int. Cl.[4] .................... H03K 4/94; H03K 17/16
[52] U.S. Cl. ...................... 307/443; 307/246; 307/451; 307/475; 307/263
[58] Field of Search ............ 307/443, 448, 451, 475, 307/570, 529, 585, 246, 263

[56] References Cited

U.S. PATENT DOCUMENTS

| | | | |
|---|---|---|---|
| 4,103,188 | 7/1978 | Morton | 307/570 |
| 4,518,873 | 5/1985 | Suzuki et al. | 307/451 |
| 4,567,378 | 1/1986 | Raver | 307/263 X |
| 4,622,482 | 11/1986 | Ganger | 307/263 X |
| 4,661,928 | 4/1987 | Yasuoka | 307/263 X |
| 4,719,369 | 1/1988 | Asano et al. | 307/451 X |
| 4,724,340 | 2/1988 | Sood | 307/451 X |
| 4,725,747 | 2/1988 | Stein et al. | 307/263 X |
| 4,727,266 | 2/1988 | Fujii et al. | 307/451 X |

*Primary Examiner*—David Hudspeth
*Attorney, Agent, or Firm*—Walter F. Dawson; Richard M. Sharkansky

[57] ABSTRACT

A CMOS output driver having precise control of rise and fall times of signals generated from the output driver on a VLSI semiconductor chip. Two time-dependent voltage generators provide a separate ramp signal to each one of the gates of a CMOS inverter circuit. The ramp signal characteristics of each voltage generator are determined by the combination of a controlled current source charging a known capacitance.

11 Claims, 3 Drawing Sheets

CMOS VLSI OUTPUT DRIVER WITH CONTROLLED RISE AND FALL TIMES

BACKGROUND OF THE INVENTION

This invention relates to CMOS VLSI Circuits and in particular to an output driver having precise control of the rise and fall times of the signals generated from such driver.

The transmission of a digital signal over an interconnect structure wherein the inherent signal's rise and fall times are comparable to or less than the signal propagation time along the interconnect from a source to a destination presents a problem traditionally referred to as the "edge-speed" problem. In the past, this effect was associated with a few selected high-speed, digitial circuit device technologies such as emitter-coupled logic (ECL). However, as all device technologies are being produced with ever shrinking physical dimensions, their associated speed of response is becoming much faster.

For high-speed digital communication, the traditional approach has been to transmit the digital signals over "transmission-line" interconnects possessing a controlled wave impedance. This approach necessitates the incorporation of line termination resistors to match the line wave impedance—typically 50-70 ohms. For general high speed VLSI circuit chips having as many as 100-200 I/O connections, this becomes a physically difficult task. Not only is it physically difficult, but it results in a significant power dissipation in the chip driver (within the chip). If line matching is not used, then undesireable "ringing" will be experienced at either or both the sending end (driver output) or receiving end (chip input). This is the result of reflections at the receiving and sending ends (or at other points of discontinuity) due to the impedance mismatching. In some cases, when the interconnect length is "short" relative to the signal rise and fall times, "wave" effects are minimal, and hence, impedance matching is not required.

In U.S. Pat. No. 4,414,480 issued to John J. Zasio on Nov. 8, 1983 it discloses that ECL circuitry generally utilizes one volt signal swings, and transmission lines having a 100 ohm characteristic impedance are typically used to provide interconnection between integrated circuit chips. CMOS technology has several advantages over ECL which makes it particularly attractive for use in high speed computers; primary among these is the fact that CMOS circuits consume little or no D.C. power, i.e. power is required only when the circuit is switching. However, CMOS circuits typically have a five volt signal swing and would have to provide a 50 milliamp drive current to drive a 100 ohm transmission line on a chip resulting in a requirement of 250 milliwatts per output line. Because of this excessive power requirement, transmission lines have not been used for interconnection between CMOS chips.

Zasio further discloses a CMOS output circuit for driving either a nonterminated transmission line, a terminated transmission line or a random wire (for relatively short distances) while achieving both low power consumption and high speed. Such output circuit is designed to have its output impedance approximately equal to the characteristic impedance of a transmission line. Also, a receiver circuit is provided which appears as an open circuit connection to a transmission line resulting in a CMOS output circuit which only has to provide one-half the signal swing required by the receiving circuit; this significantly reduces the drive current requirements of the output circuit. This approach satisfies the case of a simple single source to a single destination; however, a matrix of interconnection I/O lines cannot be accommodated in this manner.

SUMMARY OF THE INVENTION

In accordance with the present invention, a CMOS VLSI output driver circuit is provided eliminating the need for using source or destination matched transmission lines between VLSI chips by controlling the rise and fall times of an output signal being transmitted by such output driver. The output driver receives an input signal and comprises first means coupled to the input signal for providing control of the output signal rise time, second means coupled to the input signal for providing control of the output signal fall time, and means for producing the output signal having a first input coupled to an output of the first control means and a second input coupled to an output of the second control means. The signal producing means comprises a pair of complementary MOS transistors.

In accordance with the present invention, a driver circuit is provided having an output signal with controlled rise and fall times. An input signal is coupled to the driver circuit which comprises a buffer circuit coupled to the input signal for providing drive capability for the input signal, a first voltage generator means coupled to an output of the buffer circuit for providing control of the output signal rise time, a second voltage generator means coupled to the output of the buffer circuit for providing control of the output signal fall time, and complementary MOS transistors having a first input coupled to an output of the first voltage generator and a second input coupled to an output of the second voltage generator for producing the output signal. Each of the first and second voltage generators comprises a controlled source of current charging a capacitive means for controlling the output signal rise and fall times.

In accordance with a further feature of the invention, a method of controlling the rise and fall times of an output signal from a VLSI chip output circuit is provided comprising the steps of providing an input signal to the output circuit, controlling the rise time of the input signal with a first voltage generator means, controlling the fall time of the input signal with a second voltage generator means and producing the output signal having controlled rise and fall times with a pair of complementary MOS transistors having a first input coupled to an output of the first voltage generator means and a second input coupled to an output of the second voltage generator means. The method further comprises the step of adjusting the slope of the output signal rise time by selecting a saturation current for the first voltage generator means and by selecting a capacitance at the output of the first voltage generator means. The method further comprises the step of adjusting the slope of the output signal fall time by selecting a saturation current for the second voltage generator and by selecting a capacitance at the output of the second voltage generator.

BRIEF DESCRIPTION OF THE DRAWINGS

Other and further features of the invention will become apparent in connection with the accompanying drawings wherein.

DESCRIPTION OF THE PREFERRED EMBODIMENTS

Figure 1:
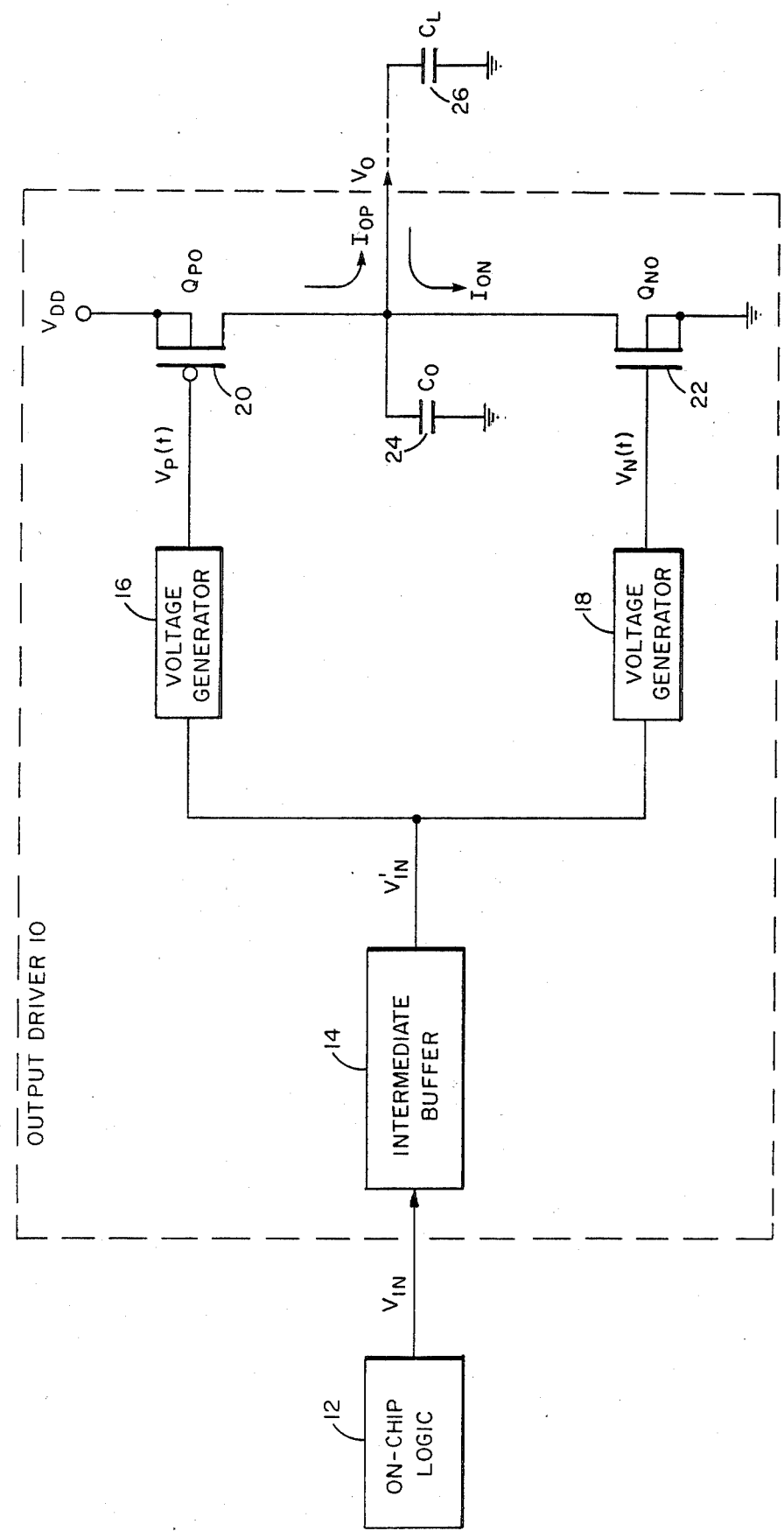
FIG. 1 is a block diagram of the output driver invention showing two time dependent voltage generators, $V_P(t)$ and $V_N(t)$ which control an output signal rise and fall times.

Referring now to FIG. 1, there is shown a functional block diagram of a complementary metal oxide semiconductor (CMOS) VLSI output driver circuit 10 having the capability of precisely controlling the rise and fall times of an output signal ($V_o$) generated by the circuit. An "on chip" logic circuit 12 generates an input signal ($V_{IN}$) to an intermediate buffer 14 located at the input of output driver 10. The intermediate buffer 14 couples the input signal ($V_{IN}$) to a pair of time dependent voltage generators 16 and 18. Voltage generator 16 controls the rise time ($\tau_R$) of the output signal ($V_o$) and voltage generator 18 controls the fall time ($\tau_F$) of the output signal ($V_o$). The outputs of voltage generators 16 and 18 are fed to a CMOS inverter including a P-channel transistor 20 and an N-channel transistor 22. The output $V_P(t)$ of voltage generator 16 is coupled to a gate input of P-channel transistor 20 and the output $V_N(t)$ of voltage generator 18 is coupled to a gate input of N-channel transistor 22. The internal capacitance 24 at the output node is represented by $C_o$ and the load capacitance 26 is represented by $C_L$. Thus, the CMOS inverter produces a time dependent intrinsic output signal $V_o$.

Figure 2:
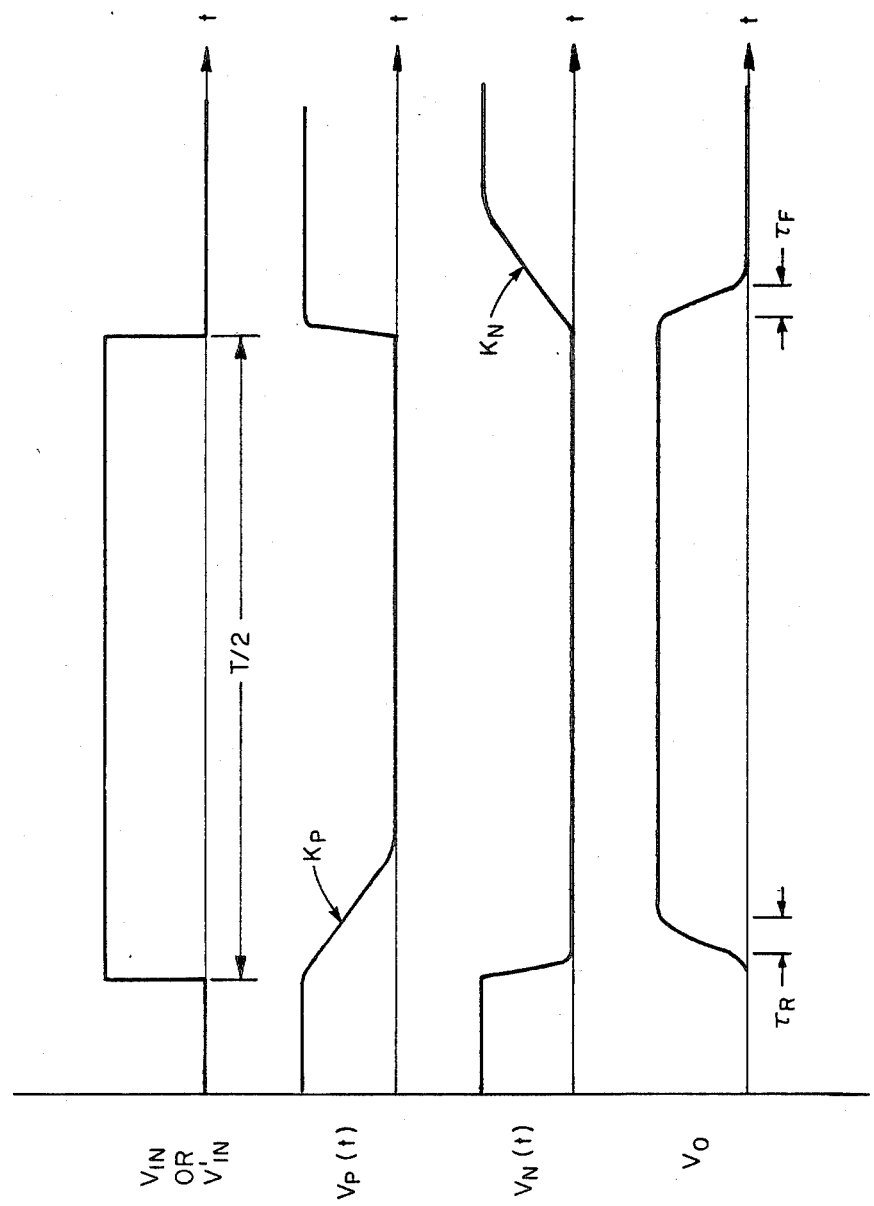
FIG. 2 is a timing diagram of signal waveforms at designated points within the output driver shown in FIG. 1.

Referring now to FIG. 2, a timing diagram of the signals at critical nodes of the output driver circuit 10 is shown. The input signal ($V_{IN}$) from the on-chip logic 12 (or $V_{IN}$ from the intermediate buffer 14) has a time duration corresponding to one-half of a clock period (T/2) assuming the chip is being clocked at a rate of $f=1/T$. Next, the voltage generator 16 signal output, $V_P(t)$, is shown having a slowed-up (ramp) leading edge of slope $K_P$ volts/sec and a normal trailing edge which is coupled to the gate of P-channel transistor 20. The signal, $V_N(t)$, from the output of voltage generator 18 is shown having a normal leading edge and a slowed-up (ramp) trailing edge of slope $K_N$ volts/sec which is coupled to the gate of N-channel transistor 22. The signals, $V_P(t)$ and $V_N(t)$, independently control the rate at which current is applied to the circuit output internal capacitance, $C_o$. The output signal, $V_O$, is shown having a rise time, $\tau_R$, determined by the leading edge of the $V_P(t)$ signal and a fall time $\tau_F$ determined by the trailing edge of the $V_N(t)$ signal. Because $V_P(t)$ and $V_N(t)$ are independent, they can be designed to produce different $\tau_R$ and $\tau_F$ times. Total independence is achieved since the falling edge of $V_N(t)$ is much faster than the falling edge of $V_P(t)$ while the rising edge of $V_P(t)$ is much faster than that of $V_N(t)$. This assures independent control of output currents, $I_{OP}$ and $I_{ON}$.

The operation and parametric design of the output driver 10 will now be described. For either $V_N(t)$ or $V_P(t)$ the critical response is given by $$V_I(t) = Kt \text{ where, } \begin{array}{l} V_I = V_P(t) \\ K = K_P \end{array} \text{ or } \begin{array}{l} V_I = K_N(t) \\ K = K_N \end{array}$$

The output currents $I_{OP}$ and $I_{ON}$ for the output transistors 20 and 22 respectively are initiated in "saturation" and given by $$I_{OP} \text{ or } I_{ON} = \frac{B_O}{2}(V_I(t) - V_T)^{n-1}$$

where, $V_T$ = transistor threshold voltage $n - 1$ = power factor to account for non-ideal performance In the above equation, $B_O$ and $V_T$ usually have some voltage dependencies. However, the power factor (n-1) is introduced to partially account for such dependencies. A transistor with no second-order effects has a power factor of (n-1)=2.

Using conventional circuit analysis known to one skilled in the art, the following equation for $V_O$ may be derived:

$$V_O = \frac{B_O}{2nKC_O}(Kt - V_T)^n$$

or $$t = \frac{1}{K}\left[\left(\frac{2KnV_OC_O}{B_O}\right)^{1/n} + V_T\right]$$

$V_T/K$ represents a delay term and $B_O$ is selected for output drive requirements.

Assume that a particular $dV_O/dt$ is required at one-half the signal output whereby $V_O=V_{DD}/2$. Then, $$K = \frac{1}{nV_{DD}}\left[\left(\frac{C_O}{B_O}\right)\left(2\frac{dV_O}{dt}\right)^n\right]^{\frac{1}{(n-1)}}$$

$C_O$ represents the internal load of the output driver. Often this has a net value based on various transistor parasitics and output protection structure. A value can be assigned that may require additional capacitance to be incorporated at the driver output. This can be easily achieved through the addition of MOS capacitance at the time of circuit and layout design.

Let the output capacitance $C_O=3Pf$. The value for $B_O$, the transistor conductance parameter, can vary widely depending on drive requirements; however, if we let $B_O=0.01$ this corresponds to a reasonably large output drive. If a rise time of 1.5 ns is desired, then $$\frac{dV_O}{dt} = \frac{5 \text{ volts}}{1.5 \text{ ns}} = 3.33 \text{ volts/ns}$$

For a worst-case non-ideal power factor, let n=2. Then, for $V_{DD}=5$ volts $K=1.33\times10^9$ and for $V_T=1$ volt $$t = 0.75[1.26(V_O)^{1/2} + 1]$$

Figure 3:
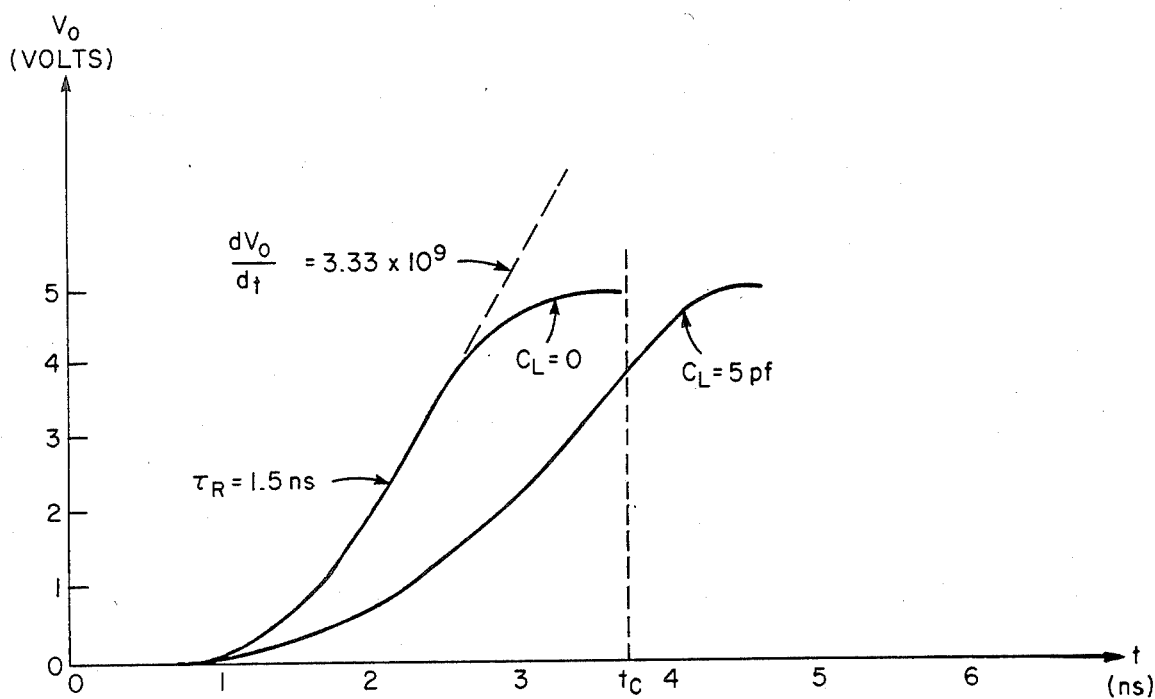
FIG. 3 shows the output signal ($V_O$) timing response from the output driver shown in FIG. 1 as a function of load capacitance, $C_L$.

Referring now to FIG. 3, the output signal, $V_O$, timing response from the output driver 10 is shown for loads of $C_L = 0$ and $C_L = 5$ pf. As $V_O$ approaches $V_{DD}$ the response becomes asymptotic to the $V_{DD}$ level. If the output is loaded $$t = 0.75\left\{1.26\left[(V_O)\left(1 + \frac{C_L}{C_O}\right)\right]^{1/2} + 1\right\}$$

This equation applies up to the time coincident with the rising ramp voltage reaching $V_{DD}$. At this point, the output transistor is in the maximum conduction state and the output voltage rises at a rate equivalent to a step-voltage applied to its input. Hence, the primary effect is on lightly loaded outputs. The response for large loads is minimally affected. In FIG. 3, the time response for a load of 5pf is shown together with the critical time ($t_c$) for which rise time control is relinquished. The critical time is given by $$t_c = \frac{V_{DD}}{K} = \frac{5}{1.33 \times 10^9} = 3.76 \text{ ns}$$

Figure 4:
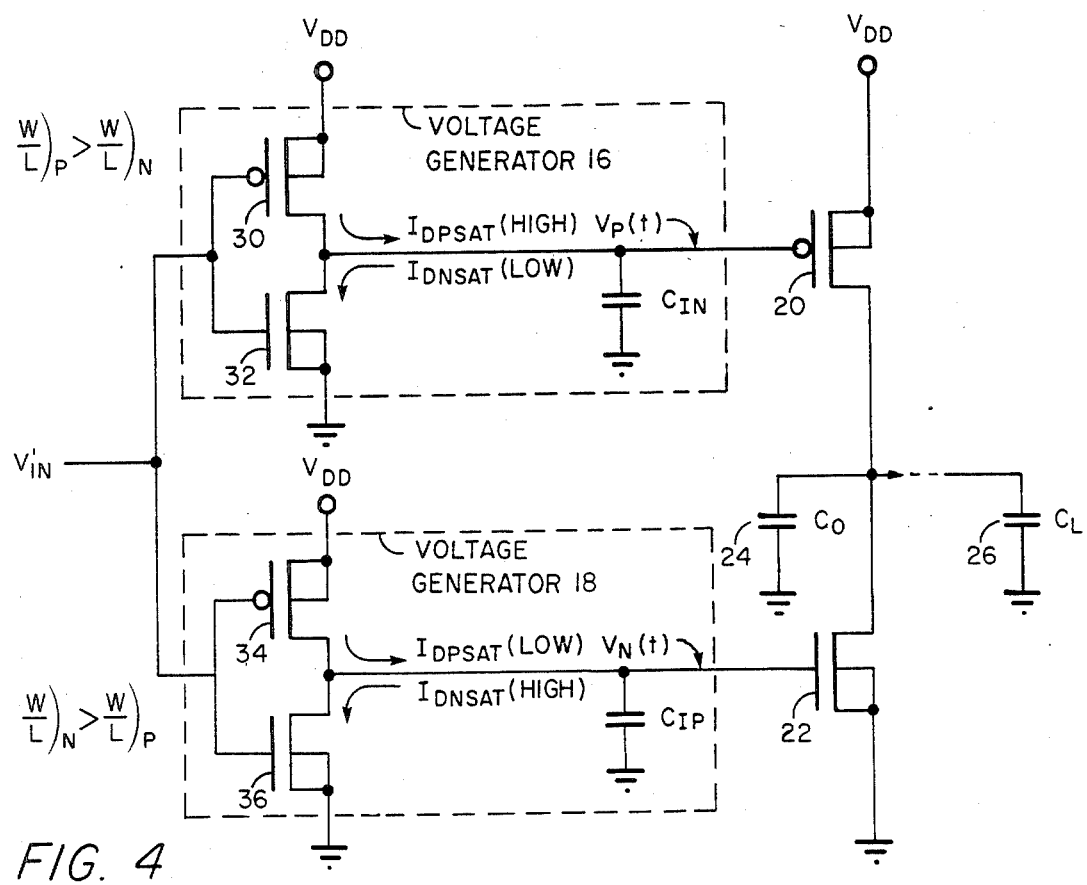
FIG. 4 is a schematic diagram showing the voltage generators of the output driver invention shown in FIG. 1.

Referring now to FIG. 4, a more detailed schematic diagram of the output driver 10 is shown. It may be designed to provide rise and fall times ranging from less than one ns to tens of ns. The circuits of the voltage generators 16 and 18 are unbalanced CMOS inverters. The unbalance refers to the relative sizes of the "P" and "N" transistors used within the CMOS inverters. For example, the voltage generator 16 shown in FIG. 4 is designed so that the width to length ratio (W/L) of the "P" transistor 30 is much greater than that of the "N" transistor 32. In a complementary manner the (W/L) ratio of the "N" transistor 36 in voltage generator 18 is much greater than that of the "P" transistor 34. The purposes of the unbalance is to control the relative magnitude of current passing through either transistors 30 and 32 or transistors 34 and 36. For example, the transistor with the larger W/L ratio passes more current than the transistor with the smaller W/L ratio.

Referring again to the timing diagram shown in FIG. 2, the voltage generator 16 produces the signal $V_P(t)$, while the voltage generator 18 produces the signal $V_N(t)$. The falling edge of $V_P(t)$ controls the output signal, $V_O$, rise time, $\tau_R$, while the rising edge of $V_N(t)$ controls the output fall time, $\tau_F$. The $V_P(t)$ signal falling edge response is given (approximately) by $$V_P(t) = \left(\frac{I_{DNSAT}}{C_{IN}}\right)t = K_P t$$

and the $V_N(t)$ signal rising edge response is given (approximately) by $$V_N(t) = \left(\frac{I_{DPSAT}}{C_{IP}}\right)t = K_N t$$

Thus, the values for $K_P$ and $K_N$ are defined.

The complementary time responses of $V_P(t)$ and $V_N(t)$, i.e. the rising edge of $V_P(t)$ and the falling edge of $V_N(t)$, respond much faster than those above since the current sourcing (sinking) capability of their companion transistors are greater. This is achieved through the (W/L) sizing selection.

The capacitors contained in the above equations, $C_{IN}$ and $C_{IP}$, and shown in FIG. 4, represent a combination of internal parasitic capacitance plus additionally added imbedded capacitance. Since the saturation currents are proportional to the MOS channel width to length (W/L) ratios of the individual transistors, then any desired $I_{DPSAT}$ or $I_{DNSAT}$ can be achieved. By incorporating an imbedded capacitance at the outputs of each of the voltage generators 16 and 18, any desired voltage-time ramp can be achieved. The imbedded capacitors $C_{IN}$ and $C_{IP}$ may be implemented with MOSFET transistors with the source-drain and substrate electrically connected. Hence, $C_{IN}$ may be an N-channel transistor and $C_{IP}$ may be a P-channel transistor. Using these elements, a fast recovery is obtained as the voltage ramp reaches its maximum excursion since $C_{IN}$ would be reduced at these voltage extremes. This reflects the intrinsic non-linear capacitance-voltage behavior of traditional MOSFET capacitors.

This concludes the Description of the Preferred Embodiment. However, many modifications and alterations will be obvious to one of ordinary skill in the art without departing from the spirit and scope of the invention concept. For example, the selection of the W/L ratios and the impedded capacitors, $C_{IN}$ and $C_{IP}$, are dependent on the particular application of the output driver. Therefore, it is intended that the scope of this invention be limited only by the appended claims.

What is claimed is:

1. A CMOS output circuit for producing an output signal comprising:
    an input signal applied to said output circuit;
    first means coupled to receive said input signal for generating an approximately linear decreasing signal for control of said output signal rise time;
    second means coupled to receive said input signal for generating an approximately linear increasing signal for control of said output signal fall time; and
    means, free of any output feedback connections, for producing said output signal having a first input coupled to an output of said first control means and a second input coupled to an output of said second control means.

2. The CMOS output circuit as recited in claim 1 wherein:
    said first control means comprises an unbalanced inverter coupled to a capacitive means.

3. The CMOS output circuit as recited in claim 1 wherein:
    said second control means comprises an unbalanced inverter coupled to a capacitive means.

4. The CMOS output circuit as recited in claim 1 wherein: said output signal producing means comprises a pair of complementary MOS transistors.

5. A driver circuit having an output signal with controlled rise and fall times comprising:
    an input signal applied to said driver circuit;
    a buffer circuit coupled to receive said input signal for providing drive capability for said input signal;
    a first voltage generator means coupled to an output of said buffer circuit for generating an approximately linear decreasing signal for signal rise time;
    a second voltage generator means coupled to said output of said buffer circuit for generating an approximately linear control of said output signal fall time; and complementary MOS transistors, free of any output feedback connections, having a first input coupled to an output of said first voltage generator and a second input coupled to an output of said second voltage generator for producing said output signal.

6. The driver circuit as recited in claim 5 wherein: said first voltage generator means comprises a controlled source of current charging a capacitive means for controlling said output signal rise time.

7. The driver circuit as recited in claim 5 wherein: said second voltage generator means compriess a controlled source of current charging a cpacitive means for controlling said output signal fall time.

8. The drive circuit as recited in claim 5 wherein: said complementary MOS transistors comprise a P-channel transistor and an N-channel transistor.

9. The method of controlling the rise and fall tims of an output signal from a VLSI chip output circuit comprsiing the steps of:

providing an input signal to said output circuit; generating an approximately linear decreasing signal in response to one edge of said input signal with a first voltage generator means;

generating an approximately linear increasing signal in response to the other edge of said input signal with a second voltage generator means; and producing said output signal having controlled rise and fall times with a pair of complementary MOS transistors, free of an output feedback connections, having a first input coupled to an output of said first voltage generator means and a second input coupled to an output of said second voltage generator means.

10. The method as recited in claim 9 further comprising the steps of:

adjusting the slope of said output signal rise time by selecting a saturation current for said first voltage generator means; and adjusting the slope of said output signal rise time by selecting a capacitance at the output of said first voltage generator means.

11. The method as recited in claim 9 further comprising the steps of:

adjusting the slope of said output signal fall time by selecting a saturation current for said second voltage generator means; and adjusting the slope of said output signal fall time by selecting a capacitance at the output of said second voltage generator.

* * * * *